United States Patent
Bai et al.

(10) Patent No.: US 9,563,313 B2
(45) Date of Patent: Feb. 7, 2017

(54) DISPLAY PANELS WITH TOUCH FUNCTIONS AND FAULT DETECTION METHOD THEREOF

(71) Applicant: Shenzhen China Star Optoelectronics Technology Co., Ltd., Shenzhen, Guangdong (CN)

(72) Inventors: Yujie Bai, Guangdong (CN); Xiaoping Tan, Guangdong (CN); Chun-hung Huang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 139 days.

(21) Appl. No.: 14/433,659

(22) PCT Filed: Jan. 5, 2015

(86) PCT No.: PCT/CN2015/070101
§ 371 (c)(1),
(2) Date: Apr. 4, 2015

(87) PCT Pub. No.: WO2016/106785
PCT Pub. Date: Jul. 7, 2016

(65) Prior Publication Data
US 2016/0349917 A1 Dec. 1, 2016

(30) Foreign Application Priority Data
Dec. 30, 2014 (CN) .......................... 2014 1 0850822

(51) Int. Cl.
*G06F 3/041* (2006.01)
*G02F 1/13* (2006.01)
(Continued)

(52) U.S. Cl.
CPC ............ *G06F 3/0418* (2013.01); *G01R 31/02* (2013.01); *G02F 1/13* (2013.01); *G02F 1/1333* (2013.01);
(Continued)

(58) Field of Classification Search
CPC combination set(s) only.
See application file for complete search history.

(56) References Cited

U.S. PATENT DOCUMENTS 9,477,111 B2 * 10/2016 Kim .................... G02F 1/13338
2010/0079402 A1 * 4/2010 Grunthaner ............ G06F 3/044
345/174

(Continued)

*Primary Examiner* — Van Chow
(74) *Attorney, Agent, or Firm* — Andrew C. Cheng

(57) ABSTRACT

A display panel with touch function and a fault detection method are disclosed. The display panel includes a display component and a touch component sharing common electrodes. The common electrodes are divided into a plurality of areas arranged in a matrix. The common electrode within each area connects to a touch chip via detection circuits. The display panel further comprises at least two switch control circuits for controlling the detection circuits corresponding to a plurality of areas in a predetermined manner such that the common electrode within each area and the common electrode within an adjacent area are controlled by different switch control circuits. When the display component is in a display state, at least two switch control circuits are configured to set up a common voltage for the common electrode in the plurality of areas. The display states of the display component in the plurality of areas are detected to determine a malfunction of the detection circuit. In this way, the TP circuit detection may be performed in an easier and more efficient way.

15 Claims, 3 Drawing Sheets

(51) Int. Cl.
*G02F 1/1333* (2006.01)
*G01R 31/02* (2006.01)
*G06F 3/044* (2006.01)
(52) U.S. Cl.
CPC ............... *G06F 3/041* (2013.01); *G06F 3/044* (2013.01); *G06F 3/0412* (2013.01); *G06F 2203/04111* (2013.01)

(56) References Cited

U.S. PATENT DOCUMENTS

| | | | | |
|---|---|---|---|---|
| 2010/0283501 A1* | 11/2010 | Tsai | ..................... | G09G 3/006 324/760.02 |
| 2013/0321010 A1* | 12/2013 | Cooley | ................ | G06F 3/0418 324/750.01 |

* cited by examiner

DISPLAY PANELS WITH TOUCH FUNCTIONS AND FAULT DETECTION METHOD THEREOF

BACKGROUND OF THE INVENTION

1. Field of the Invention

The present disclosure relates to touch technology, and more particularly to a display panel with touch functions and the fault detection method thereof.

2. Discussion of the Related Art

Conventionally, touch panels are arranged above liquid crystal panels. However, the newly developed technology is to incorporate the touch functions into the liquid crystal panels. In-cell relates to incorporating the capacitive touch functions into the liquid crystal pixels, which realizes a thinner and a lighter design of liquid crystal panels. With respect to full in-cell, TestPoints (TPs) connecting to pixels may be faulty and results in an open circuit.

SUMMARY

According to the present disclosure, the liquid crystal panels with touch functions and the fault detection method may realize efficient detection of TP circuit.

In one aspect, a display panel with touch functions includes: a display component and a touch component sharing common electrodes, the common electrodes are divided into a plurality of areas arranged in a matrix, the common electrode within each area connects to a touch chip via detection circuits, the display panel further comprises at least two switch control circuits for controlling the detection circuits corresponding to a plurality of areas in a predetermined manner such that the common electrode within each area and the common electrode within an adjacent area are controlled by different switch control circuits, when the display component is in a display state, at least two switch control circuits are configured to set up a common voltage for the common electrode in the plurality of areas, and the display states of the display component in the plurality of areas are detected to determine a malfunction of the detection circuit; wherein the display panel further comprises a plurality of switch components and at least one power supply circuit, the switch components are respectively arranged corresponding to the detection circuits, the switch components are serially connected within the detection circuit, the detection circuit further connects to the power supply circuit, the at least two switch control circuits are connected with the switch components such that the switch components are controlled to be turned on or off by the switch control circuits so as to connect or disconnect the detection circuit and the power supply circuit; a number of the power supply circuit equals to one, and the number of the switch control circuits equals to two; and the switch component, the switch control circuits, the power supply circuit, and an installation area of the touch chip are overlapped, or the switch component, the switch control circuits, the power supply circuit are arranged at one side of the common electrode far away from the installation area of the touch chip.

Wherein the touch chip electrically connects to the detection circuit arranged at one side of the switch component close to the common electrode.

In another aspect, a display panel with touch functions includes: a display component and a touch component sharing common electrodes, the common electrodes are divided into a plurality of areas arranged in a matrix, the common electrode within each area connects to a touch chip via detection circuits, the display panel further comprises two switch control circuits for controlling the detection circuits corresponding to a plurality of areas in a predetermined manner such that the common electrode within each area and the common electrode within an adjacent area are controlled by different switch control circuits, when the display component is in a display state, at least two switch control circuits are configured to set up a common voltage for the common electrode in the plurality of areas, and the display states of the display component in the plurality of areas are detected to determine a malfunction of the detection circuit.

Wherein the display panel further comprises a plurality of switch components and at least one power supply circuit, the switch components are respectively arranged corresponding to the detection circuits, the switch components are serially connected within the detection circuit, the detection circuit further connects to the power supply circuit, the at least two switch control circuits are connected with the switch components such that the switch components are controlled to be turned on or off by the switch control circuits so as to connect or disconnect the detection circuit and the power supply circuit.

Wherein a number of the power supply circuit equals to one, and the number of the switch control circuits equals to two.

Wherein the switch component, the switch control circuits, the power supply circuit, and an installation area of the touch chip are overlapped, or the switch component, the switch control circuits, the power supply circuit are arranged at one side of the common electrode far away from the installation area of the touch chip.

Wherein the touch chip electrically connects to the detection circuit arranged at one side of the switch component close to the common electrode.

In another aspect, a fault detection method for display panels with touch functions, the display panel comprises a display component and a touch component sharing common electrodes, the common electrodes are divided into a plurality of areas arranged in a matrix, the common electrodes within each areas connect to a touch chip via a detection circuit, the method includes: configuring a common voltage for common electrodes within a plurality of areas via the detection circuit when the display component is in a display state; and detecting the display state of the display component within the plurality of areas to determine the malfunction of the detection circuit.

Wherein the configuring step further comprises: configuring the common voltage of the detection circuit corresponding to a plurality of areas by the at least two switch control circuit in a predetermined manner such that the common electrode within each area and the common electrode within an adjacent area are controlled by different switch control circuits.

Wherein the configuring step further comprises applying a first level to the at least two switch control circuits, and the first level is for controlling the display component to operate in a bright state; the detecting step further comprises determining that the detection circuit corresponding to the areas operates normally when the display states of the detected areas are all in the bright state.

Wherein the configuring step further comprises applying a first level to one of the at least two switch control circuits, and the first level is for controlling the display component to operate in a bright state, and applying a second level to the other switch control circuit, and the second level, and the second level is for controlling the display component to operate in the dark state;

the detecting step further comprises: determining that the detection circuit corresponding to the areas operates normally if the areas being applied with the first level are all in the bright state and the areas being applied with the second level are all in the dark state, it is determined that the detection circuit corresponding to the areas operates normally.

Wherein the detecting step further comprises: images displayed by the display component are collected and are compared with a predetermined standard pattern.

The display panel includes a display component and a touch component sharing common electrodes. The common electrodes are divided into a plurality of areas arranged in a matrix. The common electrode within each area connects to a touch chip via detection circuits. The display panel further comprises at least two switch control circuits for controlling the detection circuits corresponding to a plurality of areas in a predetermined manner such that the common electrode within each area and the common electrode within an adjacent area are controlled by different switch control circuits. When the display component is in a display state, at least two switch control circuits are configured to set up a common voltage for the common electrode in the plurality of areas. The display states of the display component in the plurality of areas are detected to determine a malfunction of the detection circuit. In this way, the TP circuit detection may be performed in an easier and more efficient way.

DETAILED DESCRIPTION OF THE EMBODIMENTS

Embodiments of the invention will now be described more fully hereinafter with reference to the accompanying drawings, in which embodiments of the invention are shown.

Figure 1:
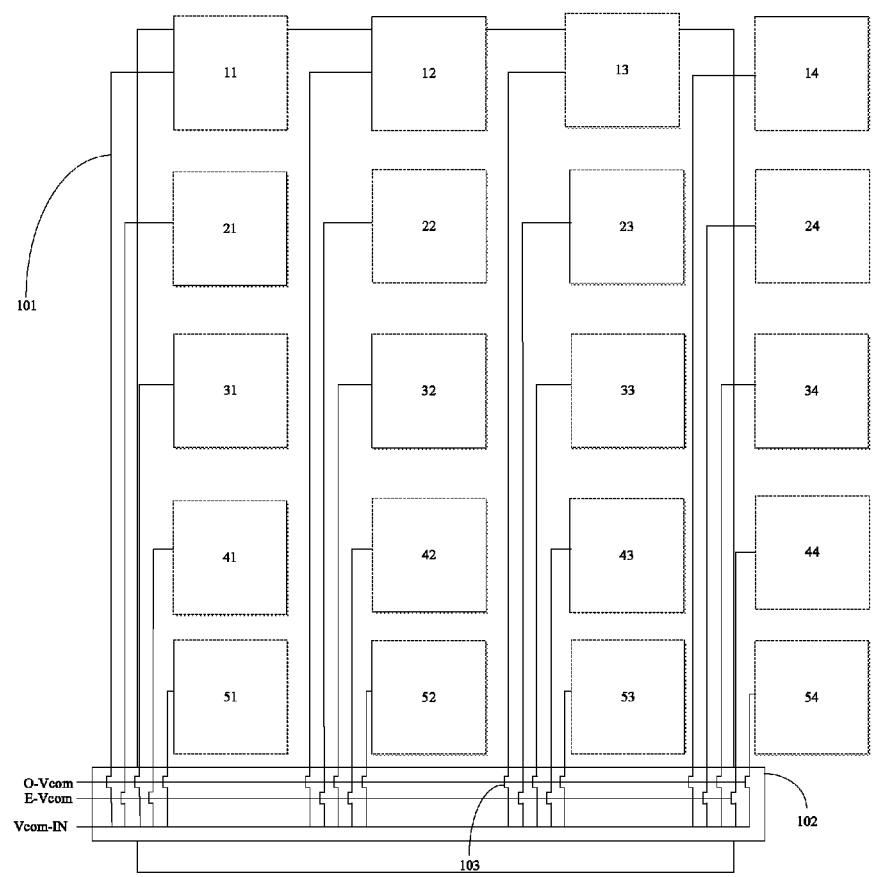
FIG. 1 is schematic view of the liquid crystal panel with touch function in accordance with a first embodiment.
Figure 2:
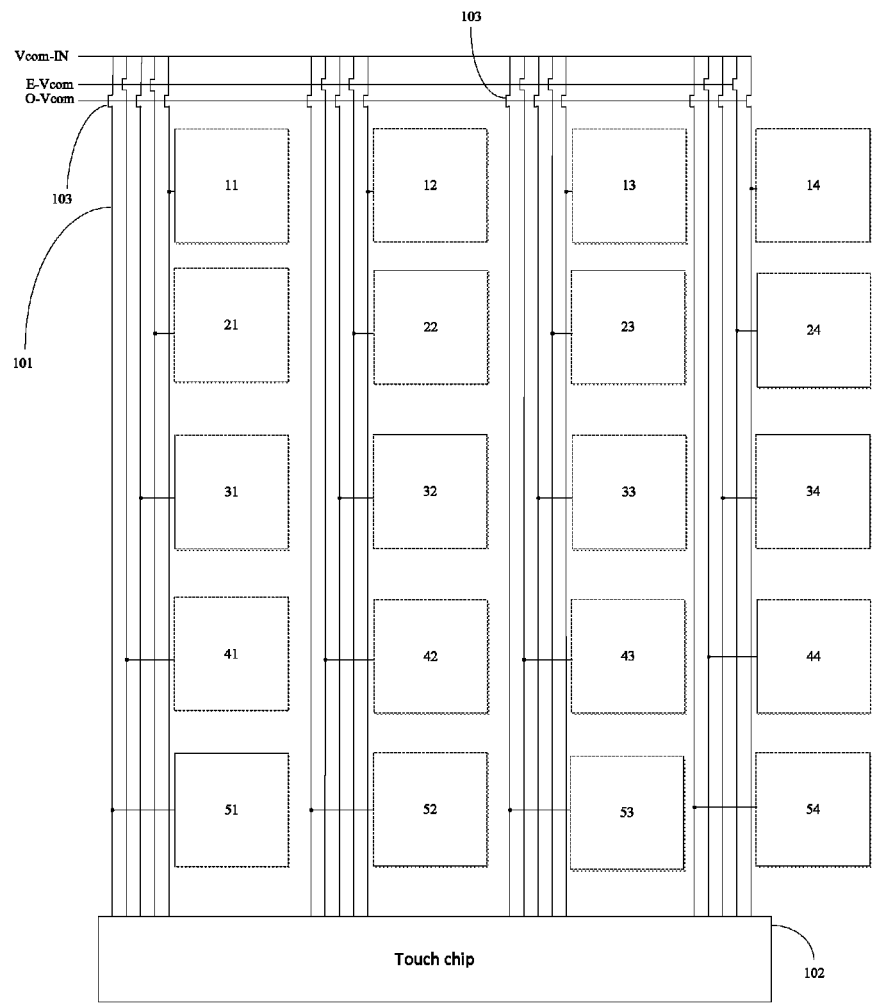
FIG. 2 is schematic view of the liquid crystal panel with touch function in accordance with a second embodiment.

FIG. 1 is schematic view of the liquid crystal panel with touch functions ("display panel") in accordance with a first embodiment. As shown, the display panel 10 includes a display component and a touch component sharing the common electrodes 11, 12, 13, 14, 21, 22, 23, 24, 31, 32, 33, 34, 41, 42, 43, 44, 51, 52, 53, 54, which define a plurality of areas arranged in a matrix. The common electrode within each area connects to a touch chip 102 via a detection circuit 101. The display panel further includes two switch control circuits (O-Vcom, E-Vcom) for controlling the detection circuit corresponding to a plurality of areas in a predetermined manner. As such, the common electrode within each area and the common electrode within an adjacent area may be controlled by different switch control circuits (O-Vcom, E-Vcom). In this way, when the display component is in a display state, at least two switch control circuits (O-Vcom, E-Vcom) may configure the common voltage for the common electrode in the plurality of areas and may perform a detection of a malfunction in accordance with the display states in the areas. In an example, a plurality of areas is shown in a 4×5 matrix. The switch control circuits (O-Vcom, E-Vcom) may control the common electrode in an interleaved manner. The common electrodes 11, 13, 22, 24, 31, 33, 42, 44, 51, 53 are controlled by the switch control circuit (O-Vcom). The common electrodes 12, 14, 21, 23, 32, 34, 41, 43, 52, 54 are controlled by the switch control circuit (E-Vcom).

In one embodiment, the display panel further includes a plurality of switch components 103 and at least one power supply circuit (Vcom-IN). The switch components 103 are respectively arranged in accordance with the detection circuit 101, and are serially connected within the detection circuit 101. The detection circuit 101 further connects to the power supply circuit (Vcom-IN). At least two switch control circuits (O-Vcom, E-Vcom) are connected with the switch components 103 such that the switch components 103 are controlled to be turned on or off by the switch control circuits (O-Vcom, E-Vcom) so as to connect or disconnect the detection circuit 101 and the power supply circuit (Vcom-IN). Preferably, the number of the power supply circuit (Vcom-IN) equals to one, and the number of the switch control circuits (O-Vcom, E-Vcom) equals to two. For instance, during a detection process, the power supply circuit (Vcom-IN) is inputted with a high level. When both of the switch control circuits (O-Vcom, E-Vcom) are inputted with the high level, all of the switch components 103 are turned on, and all of the common electrodes are in a bright state. When both of the switch control circuits (O-Vcom, E-Vcom) are inputted with a low level, all of the switch components 103 are turned off, and all of the common electrodes are in a dark state. When the switch control circuit (O-Vcom) is inputted with the high level, the switch components 103 connecting with the switch control circuit (O-Vcom) are turned on, the common electrodes 11, 13, 22, 24, 31, 33, 42, 44, 51, 53 are in the bright state. When the switch control circuit (E-Vcom) is inputted with the low level, the switch components 103 connecting with the switch control circuit (E-Vcom) are turned off, and common electrodes 12, 13, 21, 23, 32, 34, 41, 43, 52, 54 are in the dark state. If the display image is the same with a normal image indicating no faulty has occurred, it is determined that no faulty has occurred. If the display image is not the same with the normal image, it is indicative of the malfunction. In this way, the efficient detection of the TP circuit is accomplished.

In the embodiment, installation areas of the switch component 103, the switch control circuits (O-Vcom, E-Vcom), the power supply circuit (Vcom-IN), and the touch chip 102 are overlapped as shown in FIG. 1. In another example, the switch component 103, the switch control circuits (O-Vcom, E-Vcom), the power supply circuit (Vcom-IN) are arranged at one side of the common electrode that is far away from the installation area. The touch chip 102 electrically connects to the detection circuit 101 arranged at one side of the switch component 103 close to the common electrode. In one embodiment, a device for automatically recognizing display panel patterns may be configured to detect the failure of the TP circuit so as to avoid manual detection.

Figure 3:
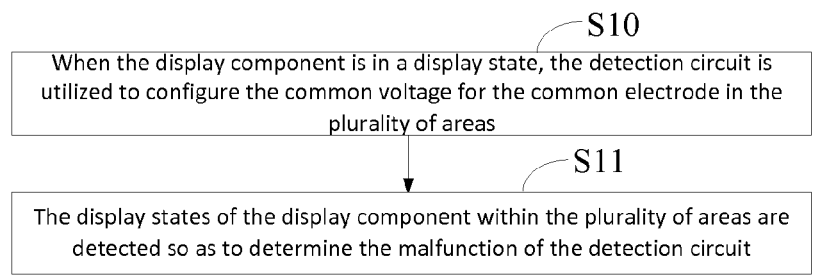
FIG. 3 is a flowchart illustrating the fault detection method of the liquid crystal panels with touch functions in accordance with one embodiment.

FIG. 3 is a flowchart illustrating the fault detection method of the liquid crystal panels with touch functions in accordance with one embodiment. The display panel includes the display component and the touch component. The display component and the touch component may share the common electrode. The common electrodes are divided into a plurality of areas arranged in a matrix. The common electrode within each area connects to the touch chip via one detection circuit. As shown in FIG. 3, the fault detection method of the liquid crystal panels with touch functions includes the following steps.

In step S10, when the display component is in a display state, the detection circuit is utilized to configure the common voltage for the common electrode in the plurality of areas.

In the embodiment, before the step S10 is executed, the power supply circuit (Vcom-IN) is inputted with the high level. The switch components are connected between the power circuit and the detection circuit and are controlled by the switch control circuits.

Figure 4:
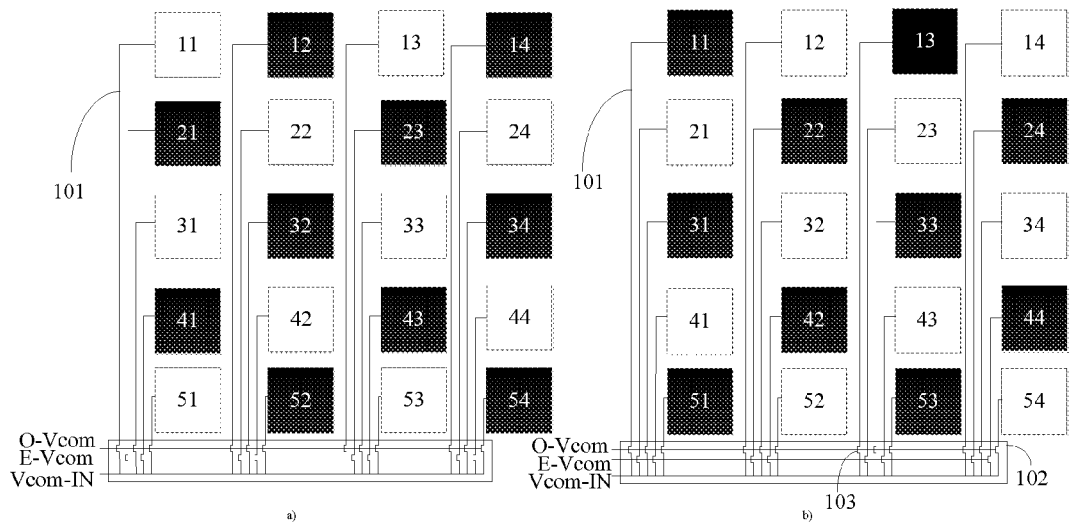
FIG. 4 is a schematic view showing the fault detection of the liquid crystal panels with touch function in accordance with one embodiment.

As shown in FIG. 4, the common electrodes are arranged in a plurality of areas in a 4×5 matrix, and the power supply circuit (Vcom-IN) provides the common voltage to the common electrode. The switch components are arranged between the power supply circuit (Vcom-IN) and the detection circuit, and are controlled by the switch control circuits (O-Vcom, E-Vcom). In step S10, at least two switch control circuits are configured for setting up the common voltage on the detection circuit corresponding to a plurality of areas in a predetermined manner such that the common electrode within each area and the common electrode within an adjacent area may be controlled by different switch control circuits. The switch control circuits (O-Vcom, E-Vcom) may control the common electrode in an interleaved manner. The common electrodes 11, 13, 22, 24, 31, 33, 42, 44, 51, 53 are controlled by the switch control circuit (O-Vcom). The common electrodes 12, 14, 21, 23, 32, 34, 41, 43, 52, 54 are controlled by the switch control circuit (E-Vcom). When the power supply circuit (Vcom-IN) is inputted with the high level, different levels are applied to the switch control circuits (O-Vcom, E-Vcom) so as to configure the common voltage for the common electrodes within the plurality of areas.

In step S11, the display states of the display component within the plurality of areas are detected so as to determine the malfunction of the detection circuit.

In step S11, when the power supply circuit (Vcom-IN) is inputted with the high level and after the common voltage of the common electrode within the areas are configured by the switch control circuits (O-Vcom, E-Vcom), the images displayed by the display component are collected and then compared with a predetermined standard pattern. If the displayed image is the same with the predetermined standard pattern, the detection circuit corresponding to the plurality of areas operates normally. If the displayed image is different from the predetermined standard pattern, the detection circuit corresponding to the plurality of areas may be faulty.

In the embodiment, when the power supply circuit (Vcom-IN) is inputted with the high level, a first level is applied to at least two switch control circuits (O-Vcom, E-Vcom). The first level is for controlling the display component to operate in the bright state. When the display states of the detected areas are all in the bright state, it is determined that the detection circuit corresponding to the plurality of areas operates normally. In an example, the first level is the high level. When the switch control circuits (O-Vcom, E-Vcom) are inputted with high level, all of the switch components are turned on. Namely, all of the common electrodes are in the bright state. When the switch control circuits (O-Vcom, E-Vcom) are inputted with the low level, all of the switch components are turned off. Namely, all of the common electrodes are in the dark state. When one of the switch control circuits (O-Vcom, E-Vcom) is inputted with the first level, the corresponding switch component is turned on. Afterward, the other switch control circuit (O-Vcom, E-Vcom) is inputted with a second level, the corresponding switch component is turned off. The second level is for controlling the display component to operate in the dark state. If the areas being inputted with the first level are all in the bright state and the areas being inputted with the second level are all in the dark state, it is determined that the detection circuit corresponding to the areas operates normally. Preferably, the second level is the low level. As shown in portion (a) in FIG. 4, when the power supply circuit (Vcom-IN) is inputted with high level, the switch control circuit (O-Vcom) is inputted with high level and the switch control circuit (E-Vcom) is inputted with the low level. The switch components connecting with the switch control circuit (O-Vcom) are turned on, and the switch components connecting with the switch control circuit (E-Vcom) are turned off. The common electrodes 11, 13, 22, 24, 31, 33, 42, 44, 51, 53 are in the bright state, and the common electrodes 12, 14, 21, 23, 32, 34, 41, 43, 52, 54 are in the dark state. As shown in portion (b) in FIG. 4, when the power supply circuit (Vcom-IN) is inputted with high level, the switch control circuit (O-Vcom) is inputted with low level and the switch control circuit (E-Vcom) is inputted with the high level. The switch components connecting with the switch control circuit (E-Vcom) are turned off, and the switch components connecting with the switch control circuit (O-Vcom) are turned off. The common electrodes 11, 13, 22, 24, 31, 33, 42, 44, 51, 53 are in the dark state, and the common electrodes 12, 14, 21, 23, 32, 34, 41, 43, 52, 54 are in the bright state. If the displayed image is the same with the predetermined standard pattern, the detection circuit corresponding to the plurality of areas operates normally. If the displayed image is different from the predetermined standard pattern, the detection circuit corresponding to the plurality of areas may be faulty.

In the embodiment, an automatically recognizing display panel patterns may be configured to detect the failure of the TP circuit so as to avoid manual detection.

In view of the above, the display panel includes the display component and the touch component. The display component and the touch component may share the common electrode. The common electrodes are divided into a plurality of areas arranged in a matrix. The common electrode within each area connects to the touch chip via one detection circuit. The display panel further includes at least two switch control circuits are configured for setting up the common voltage on the detection circuit corresponding to a plurality of areas in a predetermined manner such that the common electrode within each area and the common electrode within an adjacent area may be controlled by different switch control circuits. In addition, when the display components is in the displaying process, the display states of the areas of the display component may be detected to determine whether the detection circuit is faulty, which accomplish an easier and efficient detection for TP circuit.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display panel with touch functions, comprising:
   a display component and a touch component sharing common electrodes, the common electrodes are divided into a plurality of areas arranged in a matrix, the common electrode within each area connects to a touch chip via detection circuits, the display panel further comprises at least two switch control circuits for controlling the detection circuits corresponding to a plurality of areas in a predetermined manner such that the common electrode within each area and the common electrode within an adjacent area are controlled by different switch control circuits, when the display component is in a display state, at least two switch control circuits are configured to set up a common voltage for the common electrode in the plurality of areas, and the display states of the display component in the plurality of areas are detected to determine a malfunction of the detection circuit;

wherein the display panel further comprises a plurality of switch components and at least one power supply circuit, the switch components are respectively arranged corresponding to the detection circuits, the switch components are serially connected within the detection circuit, the detection circuit further connects to the power supply circuit, the at least two switch control circuits are connected with the switch components such that the switch components are controlled to be turned on or off by the switch control circuits so as to connect or disconnect the detection circuit and the power supply circuit;

a number of the power supply circuit equals to one, and the number of the switch control circuits equals to two; and the switch component, the switch control circuits, the power supply circuit, and an installation area of the touch chip are overlapped, or the switch component, the switch control circuits, the power supply circuit are arranged at one side of the common electrode far away from the installation area of the touch chip.

2. The display panel as claimed in claim 1, wherein the touch chip electrically connects to the detection circuit arranged at one side of the switch component close to the common electrode.

3. A display panel with touch functions, comprising:
a display component and a touch component sharing common electrodes, the common electrodes are divided into a plurality of areas arranged in a matrix, the common electrode within each area connects to a touch chip via detection circuits, the display panel further comprises two switch control circuits for controlling the detection circuits corresponding to a plurality of areas in a predetermined manner such that the common electrode within each area and the common electrode within an adjacent area are controlled by different switch control circuits, when the display component is in a display state, at least two switch control circuits are configured to set up a common voltage for the common electrode in the plurality of areas, and the display states of the display component in the plurality of areas are detected to determine a malfunction of the detection circuit.

4. The display panel as claimed in claim 3, wherein the display panel further comprises a plurality of switch components and at least one power supply circuit, the switch components are respectively arranged corresponding to the detection circuits, the switch components are serially connected within the detection circuit, the detection circuit further connects to the power supply circuit, the at least two switch control circuits are connected with the switch components such that the switch components are controlled to be turned on or off by the switch control circuits so as to connect or disconnect the detection circuit and the power supply circuit.

5. The display panel as claimed in claim 4, wherein a number of the power supply circuit equals to one, and the number of the switch control circuits equals to two.

6. The display panel as claimed in claim 4, wherein the switch component, the switch control circuits, the power supply circuit, and an installation area of the touch chip are overlapped, or the switch component, the switch control circuits, the power supply circuit are arranged at one side of the common electrode far away from the installation area of the touch chip.

7. The display panel as claimed in claim 4, wherein the switch component, the switch control circuits, the power supply circuit, and an installation area of the touch chip are overlapped.

8. The display panel as claimed in claim 7, wherein the touch chip electrically connects to the detection circuit arranged at one side of the switch component close to the common electrode.

9. A fault detection method for display panels with touch functions, the display panel comprises a display component and a touch component sharing common electrodes, the common electrodes are divided into a plurality of areas arranged in a matrix, the common electrodes within each areas connect to a touch chip via a detection circuit, the method comprising:
configuring a common voltage for common electrodes within a plurality of areas via the detection circuit when the display component is in a display state; and
detecting the display state of the display component within the plurality of areas to determine the malfunction of the detection circuit.

10. The method as claimed in claim 9, wherein the configuring step further comprises:
configuring the common voltage of the detection circuit corresponding to a plurality of areas by the at least two switch control circuit in a predetermined manner such that the common electrode within each area and the common electrode within an adjacent area are controlled by different switch control circuits.

11. The method as claimed in claim 10, wherein the configuring step further comprises applying a first level to the at least two switch control circuits, and the first level is for controlling the display component to operate in a bright state;
the detecting step further comprises determining that the detection circuit corresponding to the areas operates normally when the display states of the detected areas are all in the bright state.

12. The method as claimed in claim 11, wherein the configuring step further comprises applying a first level to one of the at least two switch control circuits, and the first level is for controlling the display component to operate in a bright state, and applying a second level to the other switch control circuit, and the second level, and the second level is for controlling the display component to operate in the dark state;
the detecting step further comprises:
determining that the detection circuit corresponding to the areas operates normally if the areas being applied with the first level are all in the bright state and the areas being applied with the second level are all in the dark state, it is determined that the detection circuit corresponding to the areas operates normally.

13. The method as claimed in claim 10, wherein the detecting step further comprises:

images displayed by the display component are collected and are compared with a predetermined standard pattern.

14. A display panel with touch functions, comprising:

a display component and a touch component sharing common electrodes, the common electrodes are divided into a plurality of areas arranged in a matrix, the common electrode within each area connects to a touch chip via detection circuits, the display panel further comprises at least two switch control circuits for controlling the detection circuits corresponding to a plurality of areas in a predetermined manner such that the common electrode within each area and the common electrode within an adjacent area are controlled by different switch control circuits, when the display component is in a display state, at least two switch control circuits are configured to set up a common voltage for the common electrode in the plurality of areas, and the display states of the display component in the plurality of areas are detected to determine a malfunction of the detection circuit;

wherein the display panel further comprises a plurality of switch components and at least one power supply circuit, the switch components are respectively arranged corresponding to the detection circuits, the switch components are serially connected within the detection circuit, the detection circuit further connects to the power supply circuit, the at least two switch control circuits are connected with the switch components such that the switch components are controlled to be turned on or off by the switch control circuits so as to connect or disconnect the detection circuit and the power supply circuit;

a number of the power supply circuit equals to one, and the number of the switch control circuits equals to two; and the switch component, the switch control circuits, the power supply circuit, and an installation area of the touch chip are overlapped.

15. The display panel as claimed in claim 14, wherein the touch chip electrically connects to the detection circuit arranged at one side of the switch component close to the common electrode.

* * * * *